(12) United States Patent
Bertrand

(10) Patent No.: US 7,374,107 B2
(45) Date of Patent: May 20, 2008

(54) METHOD OF MANUFACTURING A CONTACTLESS CARD

(75) Inventor: Pierre Bertrand, Cassis (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 11/603,094

(22) Filed: Nov. 22, 2006

(65) Prior Publication Data

US 2007/0069038 A1    Mar. 29, 2007

Related U.S. Application Data

(63) Continuation of application No. 11/319,278, filed on Dec. 29, 2005, now abandoned, which is a continuation of application No. 09/807,885, filed as application No. PCT/FR00/01263 on May 11, 2000, now abandoned.

(30) Foreign Application Priority Data

May 12, 1999 (FR) .................................. 99 06535

(51) Int. Cl.
    *G06K 19/06* (2006.01)
(52) U.S. Cl. ...................... 235/492; 235/474; 235/475; 235/487; 156/244.12

(58) Field of Classification Search ................ 235/492, 235/475, 487; 156/244.12
    See application file for complete search history.

(56) References Cited

U.S. PATENT DOCUMENTS

| 5,387,306 | A  | 2/1995  | Jarvis        |
|-----------|----|---------|---------------|
| 5,804,026 | A  | 9/1998  | Vogt          |
| 5,852,289 | A  | 12/1998 | Masahiko      |
| 6,066,231 | A  | 5/2000  | Maestri et al.|
| 6,248,199 | B1 | 6/2001  | Smulson       |
| 6,305,609 | B1 | 10/2001 | Melzer et al. |
| 6,412,701 | B1 | 7/2002  | Kohama et al. |

FOREIGN PATENT DOCUMENTS

| EP | 0350179 A1 | 1/1990  |
| EP | 0476636 A1 | 3/1992  |
| EP | 0886239 A2 | 12/1998 |

*Primary Examiner*—Seung Ho Lee
(74) *Attorney, Agent, or Firm*—Buchanan Ingersoll & Rooney PC

(57) ABSTRACT

A method for producing a contactless card having a support for the functional elements of the card. The support is provided with lower and upper covering layers, and the functional elements borne thereon are formed by means of extrusion, directly in contact with the support.

12 Claims, 2 Drawing Sheets

METHOD OF MANUFACTURING A CONTACTLESS CARD

This application is a continuation of U.S. application Ser. No. 11/319,278, filed Dec. 29, 2005 now abandoned, which is a continuation of U.S. application Ser. No. 09/807,885, filed Jul. 12, 2002 now abandoned, which is based upon French Application No. 99/06535, filed on May 12, 1999 and International Application No. PCT/FR00/01263, filed May 11, 2000.

BACKGROUND OF THE INVENTION

The present invention concerns the manufacture of integrated circuit media of the contactless type such as electronic labels or cards known as "contactless" because of their ability to exchange information at a distance with a reader in accordance with a read mode or a write/read mode.

Such cards are notably identification badges, or smart cards with more extensive functions whose applications are currently multiplying. For example, in such an application known as "remote billing", the card is debited whilst passing close to a terminal and can likewise be recharged at a distance. As a general rule, the data transmission is effected by radio frequency or microwave.

In a known method of manufacturing a contactless card, the so-called "co-lamination" technique is used. It consists here of disposing, between the platens of a press, a stack of thermoplastic sheets in the middle of which the electronic circuit for contactless transmission is positioned; and then welding the different thermoplastic sheets by pressure and raising the temperature. This method makes it possible to obtain a card in which all the electronics are embedded in the plastics material. However, because of the differences between the coefficients of expansion of the various materials used, the combined action of the pressure and temperature causes a residual deformation on the surface of the card. And the remedy for this deformation is a great burden in terms of production, since it consists of substantially extending the cycle times, notably the cooling. Another drawback of these cards is their mediocre ability to resist repeated bending stresses.

In the document EP-A-0 640 940 in the name of N.V. Nederlandsche Apparentfabriek NEDAP, a solution to this dual problem is proposed according to which an intermediate layer with a support function for the functional means of the card is interposed between two surface layers, each of the latter being fixed to the intermediate layer by a connecting layer with a lower softening temperature. This method has however the disadvantage of including a large number of steps and therefore being fairly complex to implement.

SUMMARY OF THE INVENTION

The present invention proceeds from a search for a novel solution to manufacturing integrated circuit media of the contactless type in order to surmount the aforementioned problems, at the same time as satisfying other objectives of automation of the manufacture and mass production at a high rate.

To this end, the invention consists of a method of manufacturing an integrated circuit medium of the contactless type, provided with functional elements comprising an electronic unit or chip connected to a winding with the function of an antenna, and whose body comprises a covering layer on at least one side of the said functional elements, characterised in that the said functional means are located on a support sheet, and in that the said covering layer at least is formed by extrusion, immediately in contact with the said support sheet.

In the preferential case where two covering layers are extruded, one on each side of the said support sheet, there is therefore obtained a body integrating the electronic components, and for the power supply and transmission of the system, which components are entirely embedded in the said body.

In one embodiment of the invention, the said support sheet for the said functional means is a film of dielectric material. In a variant, it is a grille or section of conductive strip (of the "lead frame" type), from which the said winding can be cut in the form of one or more turns.

According to another characteristic of the invention, the said manufacturing method is implemented by causing the said support sheet, provided in advance with the said functional means, to pass through a die for extruding the said covering layer at least. If two covering layers are provided, they are advantageously produced together by co-extrusion on the two sides of the said support sheet.

In both cases, in a preliminary step of the manufacturing method, the said support sheet, provided with the said functional card elements, is advantageously packaged in the form of a coil to be unwound continuously with a view to a continuous implementation of the extrusion or co-extrusion step, following which, after cooling, there can take place in line a step of printing and/or cutting to the final format, and/or of testing the products, and/or of deposition of printed film, magnetic track or the like on the front and/or reverse side.

According to another characteristic of the invention, the cutting step comprises a prior phase of locating, with a view to positioning for the cutting proper, the locating consisting of a detection of the said functional means through the material with which they are covered (for example by radio, ultrasound, etc). This way of proceeding is particularly advantageous when provision is made for the said support sheet to be completely embedded in the extruded material.

Where the said support sheet is a film of dielectric material constituting a central core between two coating layers obtained by co-extrusion, one or more openings are advantageously provided in the said central core of the card, so that the said bottom and top layers are co-extruded whilst being joined to each other in a monolithic fashion.

The present invention therefore also concerns an integrated circuit medium of the contactless type, such as a smart card, having a central sheet supporting functional means, and bottom and top layers, characterised in that the said support sheet has at least one opening through which the two bottom and top layers communicate. In such an assembly, the material of the bottom and top layers has, with the material situated in the said opening, at least one homogeneous molecular continuity constituting one and the same material.

Other characteristics of the invention relate to the production and/or mounting of the functional elements (the power supply coil and antenna in the form of a winding, and the electronic block or chip), on a film made of dielectric material as a central support sheet, according to which, advantageously:

the said winding is produced by metallisation of the said film;

the chip is bonded to the said film, and its contacts are connected, advantageously by soldering, to two connection wires to the said winding, the assembly consisting of the chip and its connecting wires being embedded in a drop of resin;

these two operations are performed continuously on the said film of dielectric material packaged for this purpose as a coil to be unwound continuously.

BRIEF DESCRIPTION OF THE DRAWINGS

These characteristics and advantages of the invention, as well as others, will emerge more clearly from a reading of the following description, given in relation to the accompanying drawings, in which.

DESCRIPTION OF THE INVENTION

Figure 1:
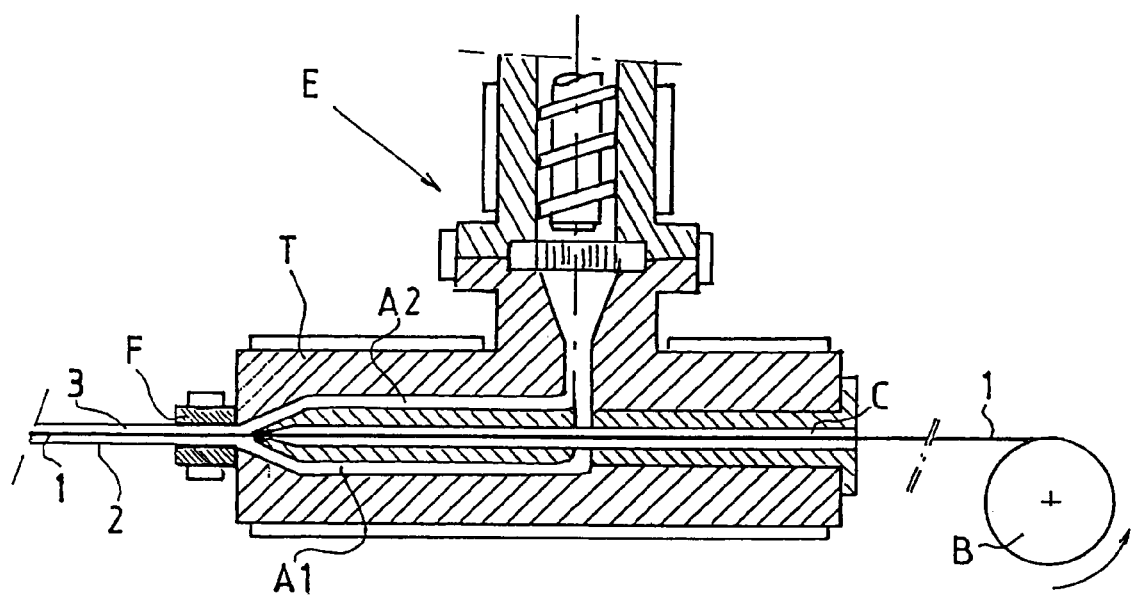
FIG. 1 is a schematic view in section illustrating in its principle an extrusion device used in one embodiment of the method according to the invention.

Considering first of all FIG. 1, it illustrates, in the method of manufacturing according to the invention a contactless card, in the form of a device, the step of producing two bottom and top layers 2 and 3 covering a central core 1 provided in advance with the functional elements of the card which, according to circumstances, can be located in variable positions thereon. The layers 2 and 3 protect the entire core 1 and its components and, as a general rule, are printed during a subsequent step of the method.

According to the invention, the two bottom and top layers 2 and 3 are produced by extrusion, directly on the core 1. In the example depicted, they are obtained simultaneously by the well-known technique of sheet extrusion, by making the core 1 equipped in advance with components pass through the die F of the extrusion device E.

To this end, the feed head T of the die F consists of a block in which there are formed a channel C for passage of the core 1, ending up at the entry to the die F, and two ducts A1 and A2 for bringing the material to be extruded emerging respectively at the bottom and top in the channel C, immediately upstream of the entry to the die F. In this way a laminate is obtained at the exit from the die F, where the thickness and appearance of the two extruded external layers 2 and 3 can be perfectly controlled in a manner known per se. In order to strengthen the connection between the extruded layers 2, 3 and the central core 1, the latter can be coated with an appropriate adhesive before passing through the extrusion device E.

In the drawing, the core 1 appears, packaged in the form of a coil B to be unwound continuously, with a view to a continuous supply to the extrusion device E and, consequently, a production at the discharge of a continuous strip of laminate which can as it stands undergo subsequent processing such as cooling and printing, the cards finally being formed only by cutting from this strip.

In practice, conventional materials for extrusion can be used, such as polyethylene terephthalate (PET) or polyvinyl chloride, etc, selected according to the materials making up the central core 1 and the functional elements of the cards to be produced.

Figure 2:
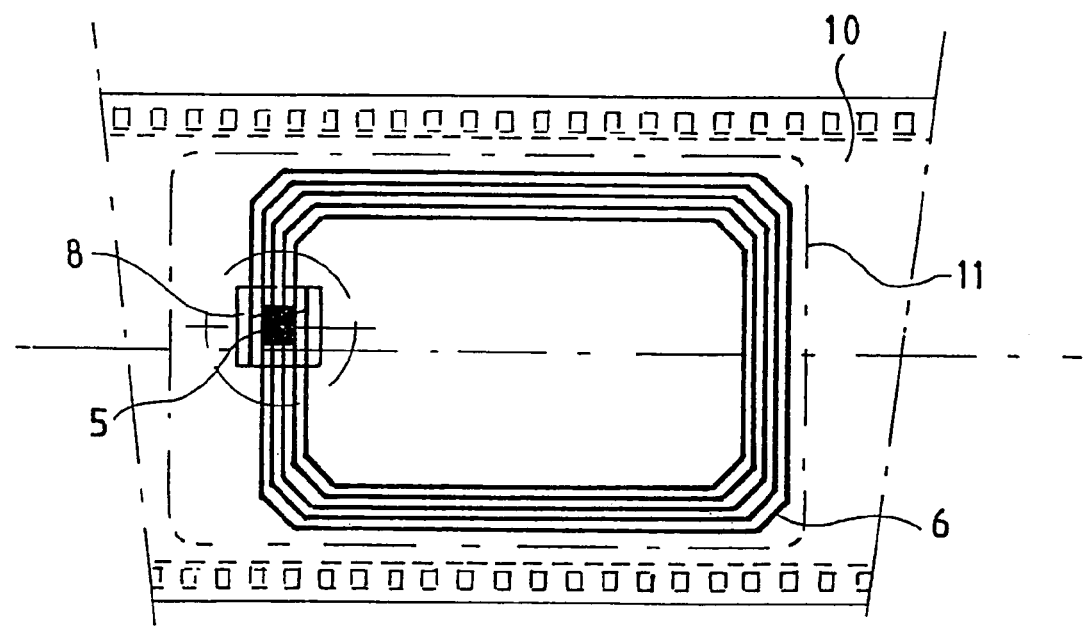
FIGS. 2 and 3 are similar plan views of a portion of film intended to constitute the central core of a card manufactured according to the invention, and provided with the functional elements of the card.

FIG. 2 illustrates a prior step in the preferred embodiment of the method according to the invention, relating to the preparation of the central core 1, which appears here as a part of a film 10 wound on a coil such as B in FIG. 1.

On the film 10, there are formed successively the same circuit arrangements each corresponding to the functional equipment of a card, and including therefore a chip 5 and a winding 6 with the function of a power supply and antenna coil.

The winding 6 is advantageously produced in a conventional manner by metallisation of the dielectric constituting the film 10, either by chemical etching or lamination of the metal, or screen printing.

Figure 4:
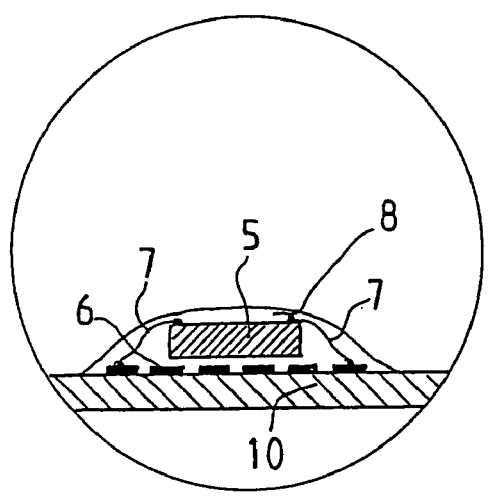
FIG. 4 is a schematic view in section of the detail fitting within a circle in FIGS. 2 and 3, illustrating the mounting of the chip on the said central core and its connection to the winding with power supply coil and antenna functions.

The mounting of the chip 5 on the film 10 is illustrated in FIG. 4: the chip 5 is first of all bonded to the film 10, and then its contacts are connected to the ends of the winding 6, notably by soldering at the end of the connecting wires 7. The whole of the chip 5 and its connecting wires 7 can then be embedded in a drop of resin 8. All these operations relating to the chip 5 and the winding 6 can therefore be carried out in line, very largely if not completely automated. In a simpler form, the winding 6 can form an integral part of the electronic unit 5, which reduces the mounting operation to the simple fixing thereof to the film 10.

In FIG. 2, there can also be seen on the film 10 a periphery 11 in fine dot and dash lines surrounding the functional assembly consisting of the chip 5 and the winding 6, and which indicates the cut which will be made finally to the format of the final product to be obtained. Notably in the case where the central core is completely embedded in the extruded material, the cut is advantageously made following a locating by detection of the means 5, 6 through the material (for example by radio, ultrasound, etc).

Figure 3:
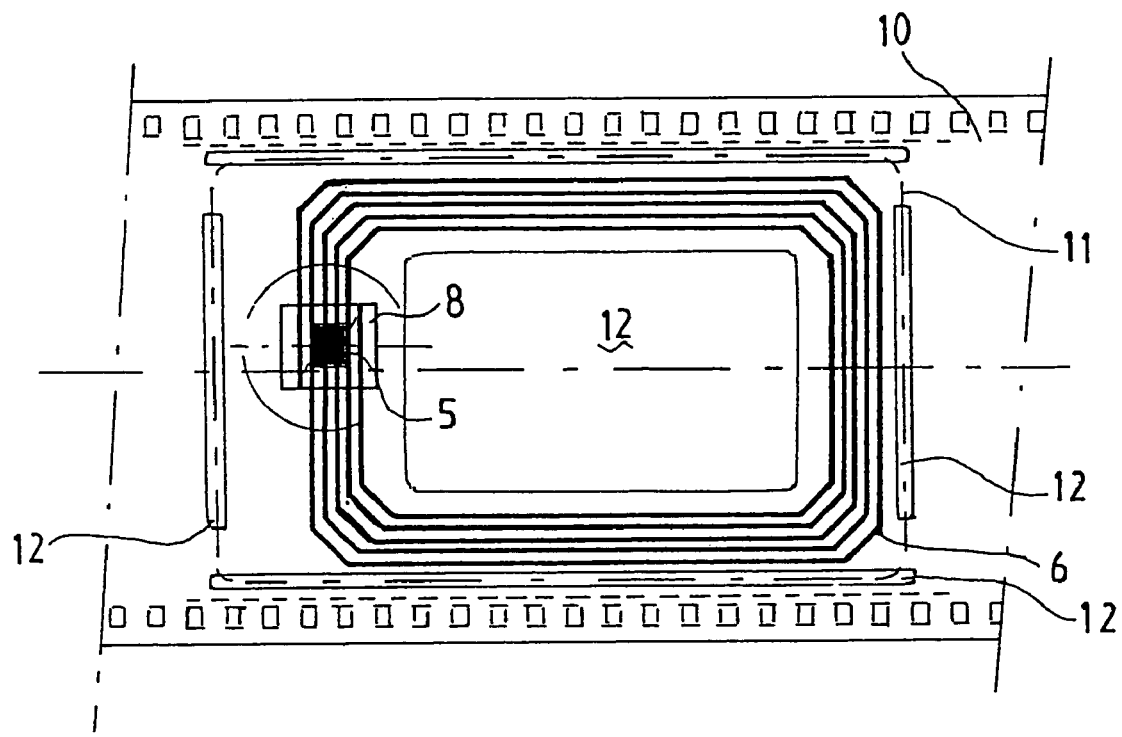

FIG. 3 is essentially identical to FIG. 2 and consequently contains the same reference signs for designating the same elements, except that in addition recesses 12 have been shown, provided in the film 10 at the location of each future card, before or after the arrangement of the equipment assemblies 5, 6. The recesses 12 are provided as a communication passage between the front and reverse sides of the film 10, which will therefore enable the extrusion material to be distributed without any break in continuity around the film, therefore constituting the surface layers 2 and 3 joined together in a monolithic fashion. By providing, in addition to a central recess, longitudinal and transverse recesses straddling the cutting periphery 11, it is possible to obtain a card body forming a quasi-continuous envelope, except at a minimal part of the periphery.

In addition to the advantages of the use of the manufacturing method emerging from the above description, the invention is also remarkable with regard to the product resulting therefrom, whose functional means are entirely protected in a plastic sheath, whose security is at a maximum since there can be no physical access to the electronic circuits without destroying the card body, and whose printable surface is increased.

The invention claimed is:

1. A method of manufacturing integrated circuit media of the contactless type that has functional elements comprising an electronic chip connected to a winding that functions as an antenna, and a body comprising a covering layer on at least one side of said functional elements, said method comprising the steps of providing said functional elements on a support sheet, transporting said support sheet with said functional elements through a die, and extruding said covering layer immediately in contact with said support sheet upstream of said die, so that a laminate comprising said support sheet and said covering layer emerges from said die.

2. A method according to claim 1, wherein said support sheet is a conductive grille in which said winding is formed.

3. A method according to claim 1 wherein said extruding step comprises passing said support sheet containing said functional elements through a die for extruding said covering layer.

4. A method according to claim 3, wherein said support sheet, provided with said functional elements, is packaged in the form of a coil to be unwound continuously during the extrusion step.

5. A method according to claim 4, further including the step, following the extrusion step and after cooling, of cutting said media to the final format for products to be obtained while said support sheet is moving along a manufacturing line.

6. A method according to claim 5, wherein the step of cutting the products to the final format includes a prior positioning phase that includes detection of said functional means through the covering layer material.

7. A method according to claim 4 further including the step, following the extrusion step, of depositing a printed film on the front and/or rear face of the products to be obtained while said support sheet is moving along a manufacturing line.

8. A method according to claim 3 wherein said support sheet comprises a film of dielectric material.

9. A method according to claim 8, wherein said covering layer comprises bottom and top layers for covering the dielectric film, which forms a central core between the two layers, and wherein said central core has one or more openings so that said bottom and top layers are coextruded whilst being joined to each other in a monolithic fashion.

10. A method according to claim 8 further including the step, prior to the step of extruding the layers of producing a winding with antenna and supply coil functions for the chip by metallisation on the dielectric material.

11. A method according to claim 10, wherein the chip is bonded to said dielectric film, and its contacts are connected to two wires for connection to said winding, and the entirety of the chip and its connection wires are embedded in a drop of resin.

12. A method according to claim 11, wherein the two operations of producing the winding and of mounting the chip are carried out continuously on a film packaged as a coil to be unwound continuously during said extrusion.

* * * * *